United States Patent
Ikeda et al.

(10) Patent No.: US 6,638,795 B2
(45) Date of Patent: Oct. 28, 2003

(54) SEMICONDUCTOR DEVICE AND METHOD OF FABRICATING THE SAME

(75) Inventors: Masanobu Ikeda, Kawasaki (JP); Satoshi Otsuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/006,239

(22) Filed: Dec. 10, 2001

(65) Prior Publication Data

US 2003/0003617 A1 Jan. 2, 2003

(30) Foreign Application Priority Data

Jul. 2, 2001 (JP) .................................. 2001-201271

(51) Int. Cl.⁷ .............................................. H01L 21/82
(52) U.S. Cl. ...................................... 438/132; 257/529
(58) Field of Search ............................... 438/132, 128, 438/601; 257/529

(56) References Cited

U.S. PATENT DOCUMENTS 5,936,296 A * 8/1999 Park et al. .................. 257/529
6,323,067 B1 * 11/2001 Ning ........................... 438/132

OTHER PUBLICATIONS

Wolf., (Silicon Processing for the VLSI Era, vol. 2, Lattice Press, pp. 192–193).*
Patent Abstract of Japan, Publication No. 11054458, dated Feb. 26, 1999.
Patent Abstract of Japan, Publication No. 2000208635, dated Jul. 28, 2000.
Patent Abstract of Japan, Publication No. 2000323580, dated Nov. 24, 2000.

* cited by examiner

Primary Examiner—David Nelms
Assistant Examiner—Quoc Hoang
(74) Attorney, Agent, or Firm—Armstrong, Westerman & Hattori, LLP

(57) ABSTRACT

A redundancy fuse is made up of a Cu—Al alloy film and a TiN film covering the surrounding surface of this Cu—Al alloy film. When this fuse is cut, the Cu—Al alloy film in the cut portion thermally diffuses by an abrupt temperature rise, and Al preferentially combines with oxygen because Al is baser than Cu. Al oxidizes in the atmosphere, and $AlO_x$ as the stable metal oxide produced sticks to the cut surfaces of the redundancy fuse to form a film in self-alignment. This film functions as a protective film to prevent the generation of corrosion.

18 Claims, 19 Drawing Sheets

DIFFUSION OF METAL AND
FORMATION OF STABLE OXIDE

AFTER FUSE IS CUT

METAL OTHER THAN Cu DIFFUSES BY ABRUPT
TEMPERATURE RISE CAUSED BY LASER SHOT,
AND DIFFUSED METAL FORMS STABLE OXIDE
ON SURFACE

MOSTr FORMATION

AFTER BULK CONTACT FORMATION

DEPOSITION OF INSULATING FILMS OF FIRST INTERCONNECTS

PATTERNING OF FIRST INTERCONNECTS

PLATING OF FIRST INTERCONNECTS

POLISHING OF FIRST INTERCONNECTS

FORMATION OF FIRST AND SECOND INTERLAYERS

PATTERNING OF VIA HOLES

ETCHING OF VIA HOLES

PROTECTION OF VIA

PATTERNING AND PRIMARY ETCHING OF SECOND INTERCONNECTS

SECONDARY ETCHING OF SECOND INTERCONNECTS

PLATING OF SECOND INTERCONNECTS

POLISHING OF SECOND INTERCONNECTS

FORMATION OF DIELECTRIC INTERLAYER

FORMATION OF FUSE AND WIRING REGIONS

FORMATION OF TiN AND Cu-Al

FORMATION OF FUSE AND WIRING REGIONS

SEMICONDUCTOR DEVICE OF FIRST EMBODIMENT

BEFORE FUSE IS CUT

DIFFUSION OF METAL AND
FORMATION OF STABLE OXIDE

AFTER FUSE IS CUT

METAL OTHER THAN Cu DIFFUSES BY ABRUPT
TEMPERATURE RISE CAUSED BY LASER SHOT,
AND DIFFUSED METAL FORMS STABLE OXIDE
ON SURFACE

CHANGES IN 1.3-μm BAND LIGHT ABSORPTANCE WHEN STRUCTURE WAS CHANGED (TiN CAP)

CHANGES IN 1.3-μm BAND LIGHT ABSORPTANCE WHEN STRUCTURE WAS CHANGED (Ti CAP)

CHANGES IN 1.3-μm BAND LIGHT ABSORPTANCE WHEN STRUCTURE WAS CHANGED (TaN CAP)

CHANGES IN 1.3-μm BAND LIGHT ABSORPTANCE WHEN STRUCTURE WAS CHANGED (Ta CAP)

CHANGES IN 1.3-μm BAND LIGHT ABSORPTANCE WHEN STRUCTURE WAS CHANGED (Ta CAP)

FORMATION OF DIELECTRIC INTERLAYER

FORMATION OF VIA HOLES

FORMATION OF UPPER AND LOWER TiN, AND Cu-Al

FORMATION OF FUSE AND INTERCONNECT

SEMICONDUCTOR DEVICE OF SECOND EMBODIMENT

SEMICONDUCTOR DEVICE AND METHOD OF FABRICATING THE SAME

CROSS-REFERENCE TO RELATED APPLICATIONS

This application is based upon and claims priority of Japanese Patent Application No. 2001-201271, filed on Jul. 2, 2001, the contents being incorporated herein by reference.

BACKGROUND OF THE INVENTION

1. Field of the Invention

The present invention relates to a semiconductor device including a wiring structure having an interconnect and redundancy fuse made of a material containing at least Cu and a method of fabricating the same, and is particularly preferably applicable when a Cu interconnect is formed by the damascene process.

2. Description of the Related Art

Recently, as the degree of integration of semiconductor elements increases and the chip size decreases, the microfabrication of interconnects and the formation of multi-level interconnects are advancing acceleratedly. In a logic device having this multi-level interconnect, a wiring delay is becoming one dominant cause of a device signal delay. The device signal delay is proportional to the product of the wiring resistance and the wiring capacitance. Accordingly, it is important to reduce the wiring resistance and the wiring capacitance in order to reduce the wiring delay.

To reduce the wiring resistance, therefore, the formation of a Cu interconnect is being studied. Especially in a global wiring portion having large influence on the wiring delay, the combination of a low-dielectric-constant film and a Cu interconnect greatly helps improve the device performance.

In a common semiconductor device, a redundancy fuse is formed to obtain redundancy of, e.g., an interconnect. For the sake of convenience, this fuse is formed by the same metal as used for an interconnect. Accordingly, in a semiconductor device using a Cu interconnect, the use of Cu as a material not only for an interconnect but also for a redundancy fuse is desired.

When Cu is used as the material of a redundancy fuse and the fuse is to be cut by a laser beam, it is necessary to select a laser wavelength causing no damage to Si as the main component of this semiconductor device. However, the absorptance to Cu at this wavelength of a laser beam is low, so a laser beam having this wavelength cannot meet variations in the thickness of the redundancy fuse. This makes reliable cutting impossible.

To solve this problem, the formation of a light absorbing layer on a Cu redundancy fuse is proposed as disclosed in, e.g., Japanese Patent Laid-Open Nos. 2000-323580 and 2000-208635. By this method, a redundancy fuse can be cut by a laser beam having the above wavelength. However, after this cutting step, a bias must be applied to the cut portion of the redundancy fuse in order to determine which memory cell is effective. During this determination, corrosion occurs in the cut portion owing to humidity and the bias, and this cut portion which is once cut and insulated is again connected. As a consequence, the device can no longer operate as a semiconductor device.

As described above, the use of Cu as a wiring material can reduce the wiring resistance and suppress the wiring delay, but poses a serious problem that the effective formation and use of a semiconductor device become difficult.

SUMMARY OF THE INVENTION

The present invention has been made in consideration of the above problem, and has as its object to provide a semiconductor device including a Cu interconnect and a Cu-containing fuse, which allows the fuse to be stably and reliably cut and, after the cutting, does not produce any inconvenience such as corrosion even in a normal temperature-humidity (e.g., a temperature of 27° C. and a humidity of 60%) atmosphere, thereby preventing defective operations and achieving high reliability, and to provide a method of fabricating the same.

The present inventors made extensive studies and have reached various aspects of the invention presented below.

An object of the present invention is a semiconductor device comprising a wiring structure having an interconnect and fuse made of a material containing at least Cu. The present invention is characterized in that the fuse comprises an alloy material consisting of a metal capable of forming a metal oxide and Cu, and a metal material which covers the surrounding surface of the alloy material and has absorption to the wavelength of a laser beam used to cut the fuse.

In this device, the metal material is preferably one member or a combination of two or more members selected from the group consisting of Ti, TiN, W, WN, Ta, TaN, and TiW. Also, the metal capable of forming the metal oxide is preferably one member or a combination of two or more members selected from the group consisting of Mg, Zr, Al, and Be.

A large addition amount by which a film of the metal oxide is reliably formed when the fuse is cut is necessary. Therefore, the content of the metal capable of forming the metal oxide in the alloy material is favorably a value within the range of 1 to 10 atm %.

Conventionally, attempts using Cu alloys in the formation of interconnects have been made (e.g., Japanese Patent Laid-Open No. 11-54458). In any of these attempts, to avoid a rise of the resistivity of Cu caused by nonuniform diffusion of added metals, the addition amount of a metal is restricted to a low-concentration range, i.e., 0.05 to 6 atm % when the added metal is Mg, and 0.05 to 0.3 atm % when the added metal is Al. In contrast, in the present invention a Cu alloy is primarily used in the formation of a fuse. Therefore, unlike the conventional attempts, the range of the addition amount of the added metal is the above-mentioned value, since the range need only be the one within which no flocculation occurs.

In the present invention, even when the fuse is irradiated with a laser beam having a wavelength selected to prevent damage to Si, the fuse is reliably cut because the metal material covering the surrounding surface of the alloy material well absorbs the laser beam. In addition, the alloy material in the cut portion thermally diffuses by an abrupt temperature rise, and the metal (other than Cu) in the alloy material oxidizes in the atmosphere. The stable metal oxide produced sticks to the cut surfaces of the fuse to form a film in self-alignment. This film functions as a protective film to prevent the generation of corrosion. In the present invention as described above, even when Cu interconnects are used in a semiconductor device and a Cu alloy is also used as a fuse accordingly, it is possible to reliably cut the fuse and protect the cut surfaces.

DETAILED DESCRIPTION OF THE PREFERRED EMBODIMENTS

Preferred embodiments of the present invention will be described in detail below with reference to the accompanying drawings.

(First Embodiment)

The first embodiment will be described below. In this embodiment, a semiconductor device including a wiring structure having a Cu multi-level interconnect and a redundancy fuse, as the main constituent elements of the present invention, and a method of fabricating the same will be explained. For the sake of convenience, the structure of the semiconductor device will be explained along with its fabrication method.

FIGS. 1A to 9 are schematic sectional views showing the method of fabricating the semiconductor device according to the first embodiment in order of steps.

Formation of MOS Transistor Structure

First, a MOS transistor structure is formed on a semiconductor substrate.

Figure 1A:
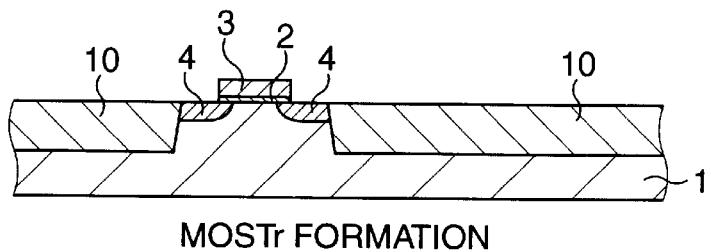
FIGS. 1A to 1D are schematic sectional views showing a method of fabricating a semiconductor device according to the first embodiment in order of steps.

More specifically, as shown in FIG. 1A, element isolation is performed on a silicon semiconductor substrate 1 by LOCOS or STI. In this embodiment, STI is used to form an element isolation structure 10 by filling a trench formed in the semiconductor substrate 1 with an insulator, thereby defining an element active region.

Next, a thin gate insulating film 2 made of $SiO_2$ or SiON is formed on the semiconductor substrate 1, and a polysilicon film is formed on this gate insulating film 2. The polysilicon film and the gate insulating film 2 are patterned to form a gate electrode 3 on the semiconductor substrate 1 via the gate insulating film 2. This gate electrode 3 is used as a mask to implant impurity ions into the surface layer of the semiconductor substrate 1 at the two sides of the gate electrode 3, thereby forming a source/drain 4 to obtain a MOS transistor structure.

Formation of Wiring Structure

Subsequently, the wiring structure described above is formed.

For the sake of convenience, the semiconductor substrate 1 and the MOS transistor structure are not shown in FIGS. 1B to 8B.

Figure 1B:
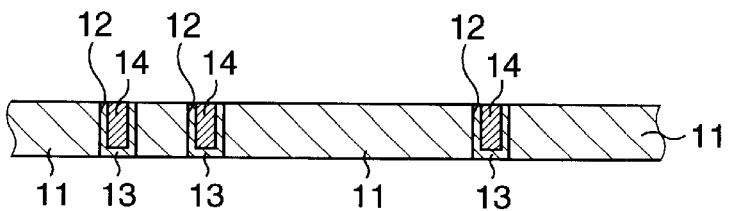

First, as shown in FIG. 1B, a dielectric interlayer 11 is so formed as to cover the semiconductor substrate 1, and via holes 12 communicating with a lower wiring layer are formed in this dielectric interlayer 11. An undercoat 13 made of, e.g., TiN is formed to cover the inner walls of these via holes 12. A W film is deposited to have a film thickness by which the via holes 12 are filled, and subjected to chemical mechanical polishing (CMP) to form W plugs 14 such that W is buried only in the via holes 12.

Figure 1C:
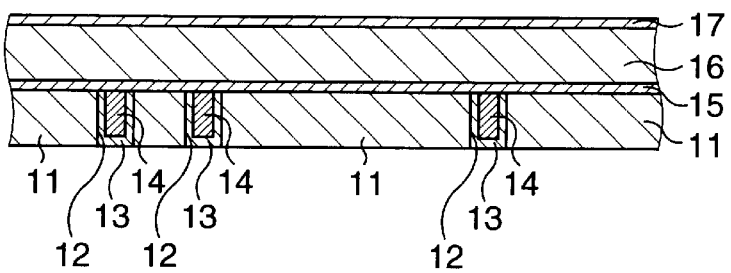

Subsequently, as shown in FIG. 1C, an $Si_3N_4$ film 15 about 30 nm thick is formed on the dielectric interlayer 11 and the W plugs 14. A dielectric interlayer 16 about 500 nm thick made of FSG (Fluoro-Silicate Glass) is deposited on the $Si_3N_4$ film 15, and an antireflection film 17 against exposure by photolithography is formed.

Figure 1D:
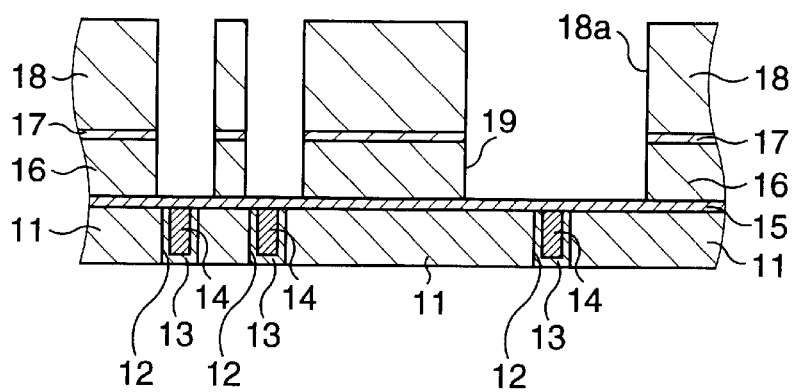

As shown in FIG. 1D, a photo resist 18 is formed by coating and processed by photolithography to form wiring trench patterns 18a open on the W plugs 14. This photo resist 18 is used as a mask and the $Si_3N_4$ film 1 is used as an etching stopper to dry-etch the antireflection film 17 and the dielectric interlayer 16.

Figure 2A:
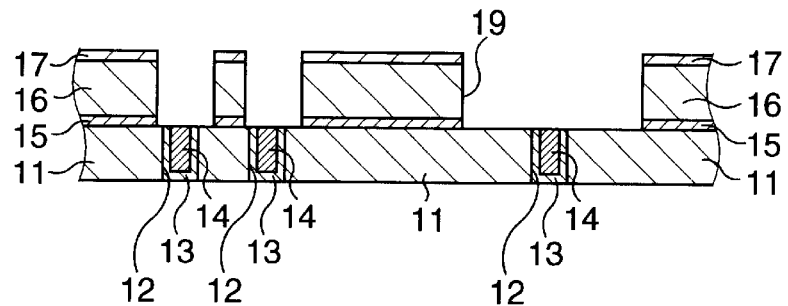
FIGS. 2A to 2C are schematic sectional views showing the method of fabricating the semiconductor device according to the first embodiment in order of steps following FIGS. 1A to 1D.

As shown in FIG. 2A, the photo resist 18 is removed by ashing or the like. After that, the $Si_3N_4$ film 15 is dry-etched to expose the surfaces of the dielectric interlayer 11 and the W plugs 14, forming first wiring trenches 19 along the wiring trench patterns.

Figure 2B:
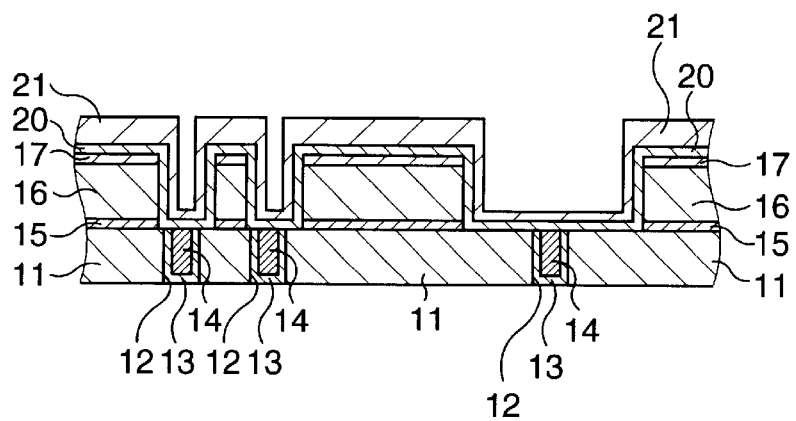

As shown in FIG. 2B, a TaN barrier metal film 20 about 25 nm thick and a Cu film 21 about 200 nm thick as a seed metal film are successively deposited in a vacuum by using a clustered sputtering apparatus. In this step, the RF processing and the formation of the barrier metal film 20 and the Cu film 21 are desirably successively performed in a vacuum.

Figure 2C:
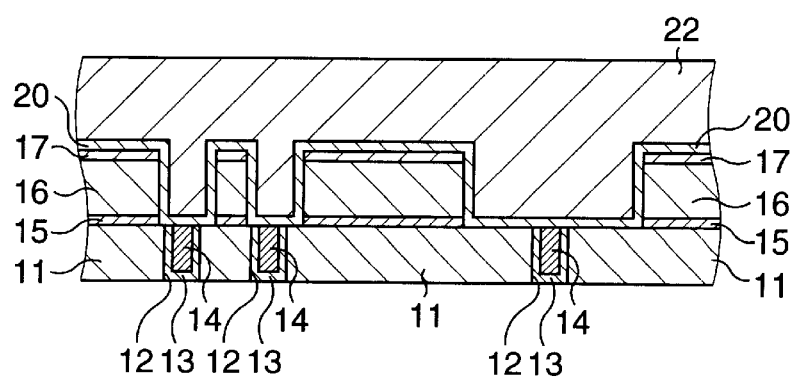

As shown in FIG. 2C, the barrier metal 20 is used as an electrode to form, by plating, a Cu film 22 having a film thickness, about 1 $\mu$m in this embodiment, by which the first wiring trenches 19 are filled.

Figure 3A:
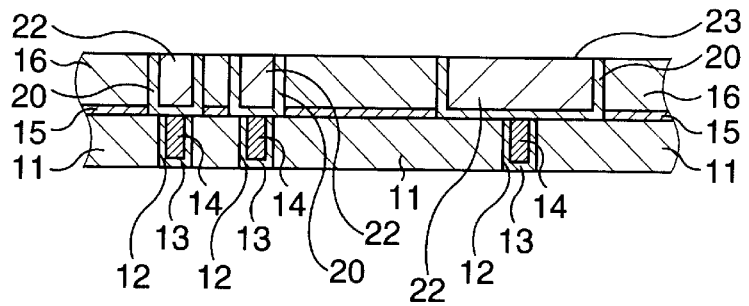
FIGS. 3A to 3C are schematic sectional views showing the method of fabricating the semiconductor device according to the first embodiment in order of steps following FIGS. 2A to 2C.

Subsequently, as shown in FIG. 3A, to separate the Cu film 22 by the damascene process, the Cu film 22 (21) and the barrier metal film 20 are polished by CMP to leave the Cu film 22 only in the first wiring trenches 19, forming first interconnects 23.

Figure 3B:
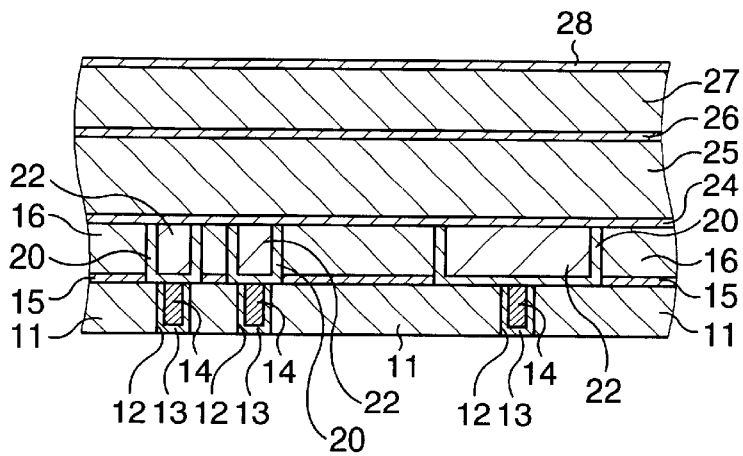

As shown in FIG. 3B, an $Si_3N_4$ film 24 about 70 nm thick serving as a diffusion barrier (passivation) on the surfaces of the first interconnects 23 is deposited. Next, on this $Si_3N_4$ film 24, an FSG dielectric interlayer 25 about 700 nm thick, an $Si_3N_4$ film 26 about 30 nm thick, and another FSG dielectric interlayer 27 about 700 nm thick are formed in this order, and an antireflection film 28 is also formed.

Figure 3C:
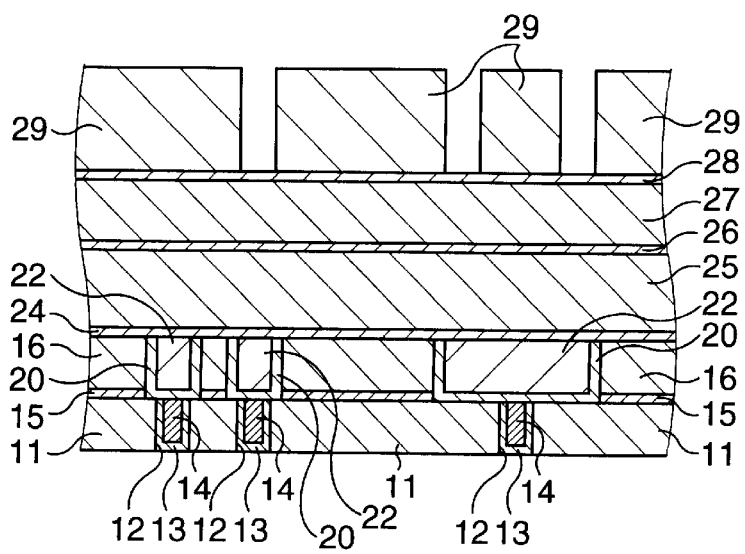

As shown in FIG. 3C, a photo resist 29 is formed by coating and processed by photolithography to form opening patterns 29a open on the first interconnects 23.

Figure 4A:
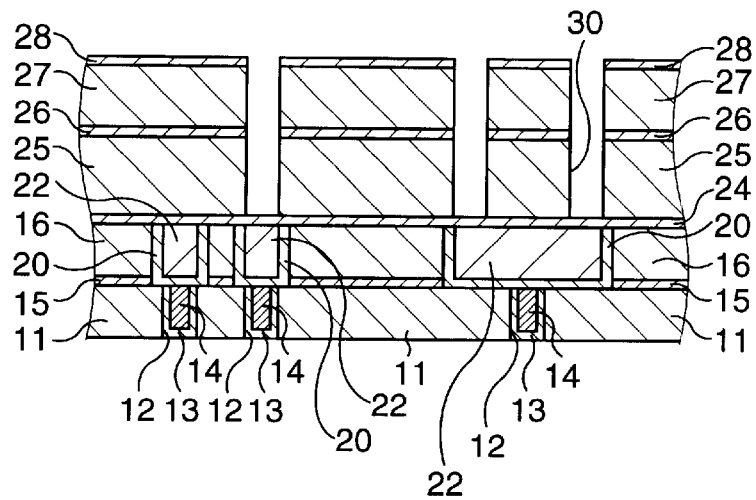
FIGS. 4A and 4B are schematic sectional views showing the method of fabricating the semiconductor device according to the first embodiment in order of steps following FIGS. 3A to 3C.

As shown in FIG. 4A, the photo resist 29 is used as a mask and the $Si_3N_4$ film 24 is used as an etching stopper to dry-etch the antireflection film 28, the dielectric interlayer 27, the $Si_3N_4$ film 26, and the dielectric interlayer 25, forming via holes 30 along the opening patterns 29a. The photo resist 29 is then removed by ashing or the like.

Figure 4B:
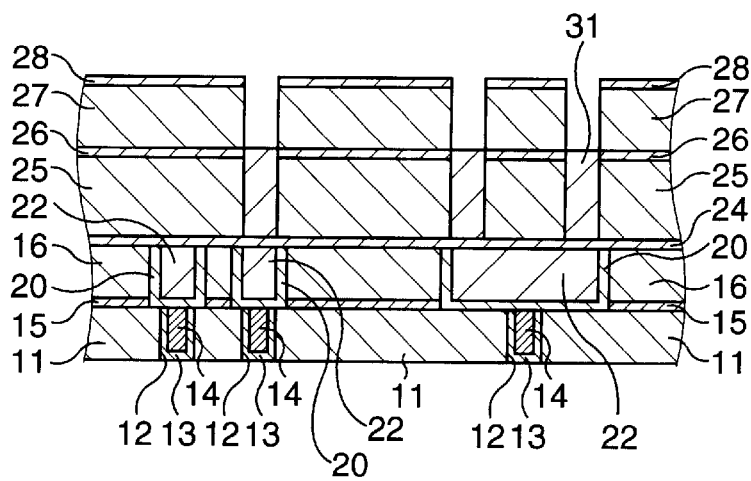

As shown in FIG. 4B, a protective material 31 such as a resist is buried in the lower half of each formed via hole 30 in order to prevent surface oxidation of the first interconnect 23.

Figure 5A:
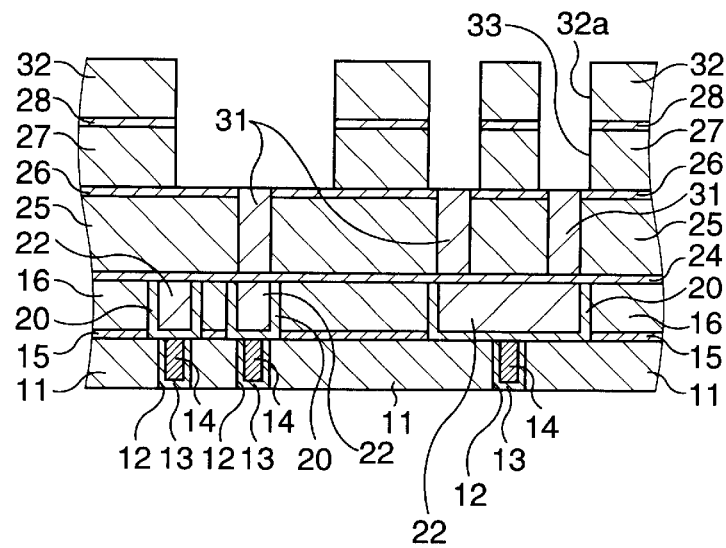
FIGS. 5A and 5B are schematic sectional views showing the method of fabricating the semiconductor device according to the first embodiment in order of steps following FIGS. 4A and 4B.

Subsequently, as shown in FIG. 5A, a photo resist 32 is formed by coating and processed by photolithography to form wiring layer patterns 32a open on the via holes 30. This photo resist 32 is used as a mask and the $Si_3N_4$ film 26 is used as an etching stopper to dry-etch the antireflection film 28 and the dielectric interlayer 27, forming second wiring trenches 33 along the wiring layer patterns 32a.

Figure 5B:
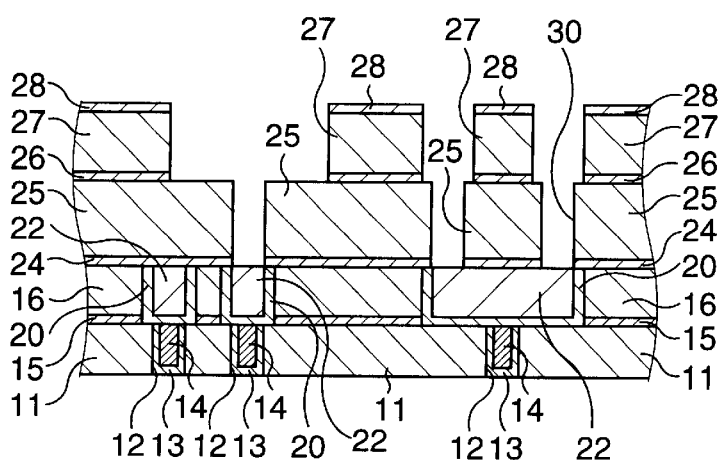

As shown in FIG. 5B, the photo resist 32 and the protective material 31 are removed by ashing or the like. After that, the $Si_3N_4$ film 24 remaining on the bottom of each via hole 30 and the $Si_3N_4$ film 26 remaining on the bottom of each second wiring trench 33 are removed by non-masking dry etching. Consequently, the second wiring trenches 33 and the via holes 30 are integrated.

Figure 6A:
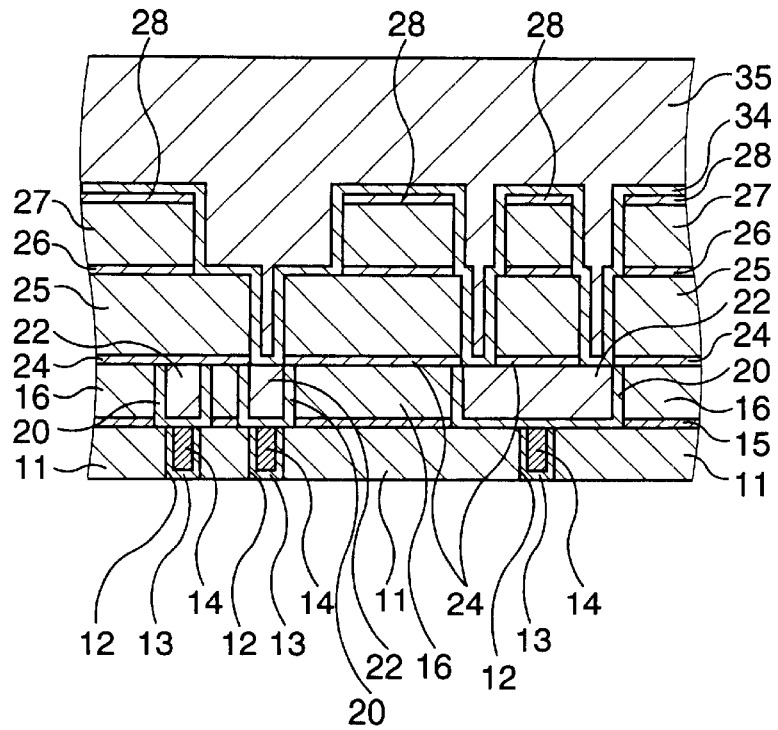
FIGS. 6A and 6B are schematic sectional views showing the method of fabricating the semiconductor device according to the first embodiment in order of steps following FIGS. 5A and 5B.

As shown in FIG. 6A, a TaN barrier metal film 34 about 25 nm thick and a Cu film 21 about 200 nm thick as a seed metal film are successively deposited in a vacuum by using a sputtering apparatus. The barrier metal 34 is used as an electrode to form, by plating, a Cu film 35 having a film thickness, about 1 $\mu$m in this embodiment, by which the second wiring trenches 33 and the via holes 30 are filled.

Figure 6B:
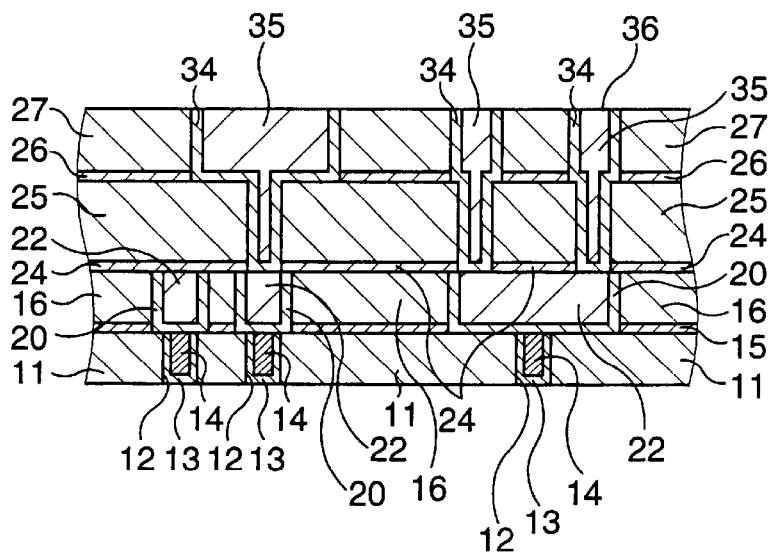

Subsequently, as shown in FIG. 6B, to separate the Cu film 35 by the damascene process, the Cu film 35 and the barrier metal film 34 are polished by CMP to leave the Cu film 35 only in the second wiring trenches 35 and the via holes 30. After that, the resultant structure is cleaned by the wet process to form second interconnects 36, thereby completing a lower wiring layer including the first interconnects 23 and the second interconnects 36.

Figure 7A:
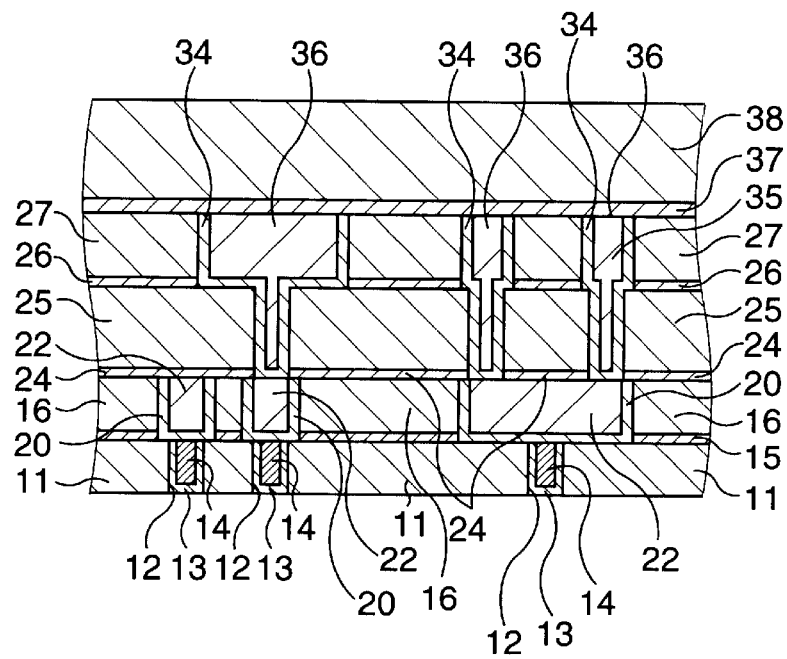
FIGS. 7A and 7B are schematic sectional views showing the method of fabricating the semiconductor device according to the first embodiment in order of steps following FIGS. 6A and 6B.

As shown in FIG. 7A, an $Si_3N_4$ film 37 about 100 nm thick serving as a diffusion barrier (passivation) on the surfaces of the second interconnects 36 is deposited. After that, an $SiO_2$ film 38 about 1 $\mu$m thick is formed as a dielectric interlayer.

Figure 7B:
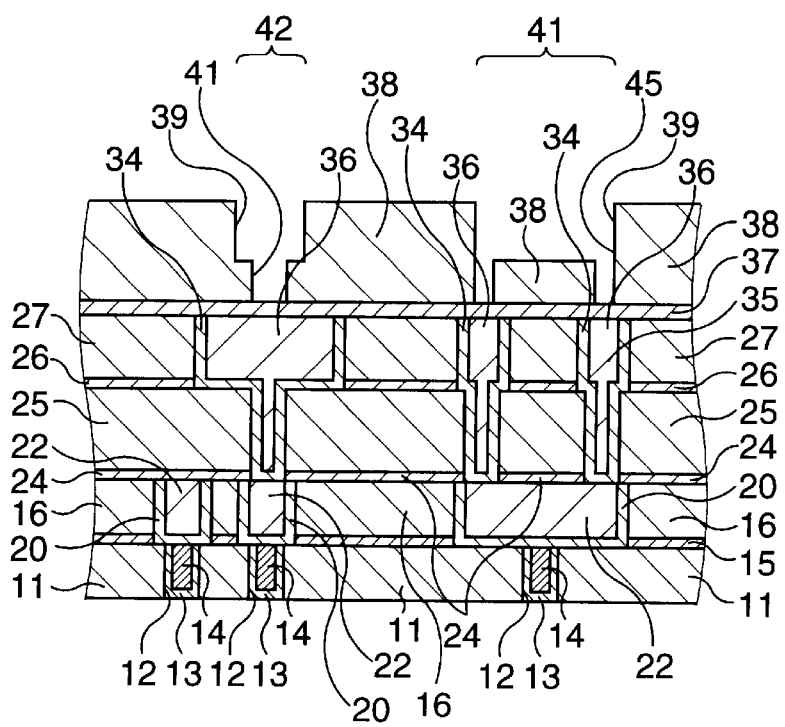

As shown in FIG. 7B, the $Si_3N_4$ film 37 and the $SiO_2$ film 38 are patterned to form via holes 45 partially exposing the surfaces of the second interconnects 36. After the photo resist is removed, the $SiO_2$ film 38 is patterned to form third wiring trenches 39 which expose the surfaces of the second interconnects 36 through the via holes 45. Referring to FIG. 7B, the right-hand region is a fuse region 41, and the left-hand region is a wiring region 42.

Figure 8A:
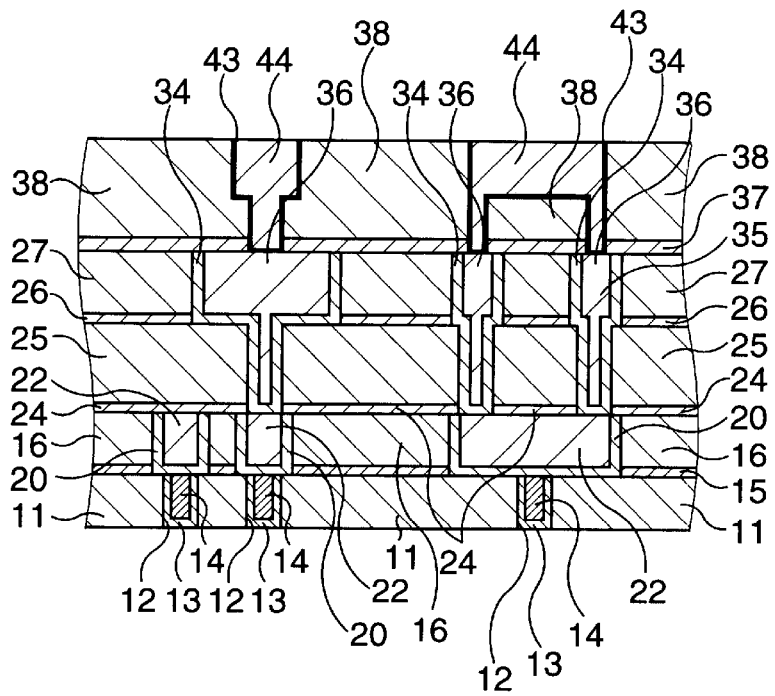
FIGS. 8A and 8B are schematic sectional views showing the method of fabricating the semiconductor device according to the first embodiment in order of steps following FIGS. 7A and 7B.

As shown in FIG. 8A, a TiN film 43 about 100 nm thick is formed by sputtering so as to cover the inner walls of the third wiring trenches 39 and the via holes 45.

While the vacuum state when the TiN film 43 is formed is kept, a Cu alloy, in this embodiment a Cu—Al alloy film 44, is deposited by sputtering so as to fill the third wiring trenches 39 and the via holes 45. The Al addition amount of this Cu—Al alloy film 44 is preferably a value within the range of 1 to 10 atm %, since a large addition amount by which a metal oxide film to be described later can be reliably formed is necessary when a redundancy fuse is cut.

The $SiO_2$ film 38 is then used as a stopper to polish the Cu—Al alloy film 44 and the TiN film 43 by CMP, and dishing of about 0.05 to 0.10 $\mu$m is performed.

Figure 8B:
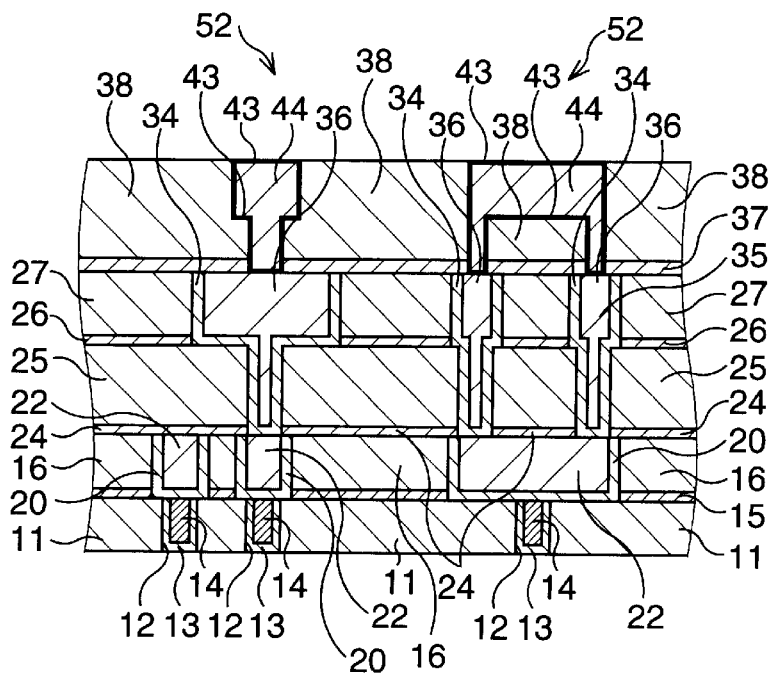

Subsequently, as shown in FIG. 8B, another TiN film 43 about 100 nm film is deposited by sputtering so as to cover the upper surface of the Cu—Al alloy film 44, and the $SiO_2$ film 38 is used as a stopper to polish this TiN film 43 by CMP. Consequently, in the fuse region 41, a redundancy fuse 51 is formed which fills the third wiring trench 39 and the via hole 45 and consists of the TiN film 43 and the Cu—Al alloy film 44 entirely surrounded by the TiN film 43. In the wiring region 42, an upper wiring layer 52 is formed which similarly consists of the TiN film 43 and the Cu—Al alloy film 44 entirely surrounded by the TiN film 43.

Figure 9:
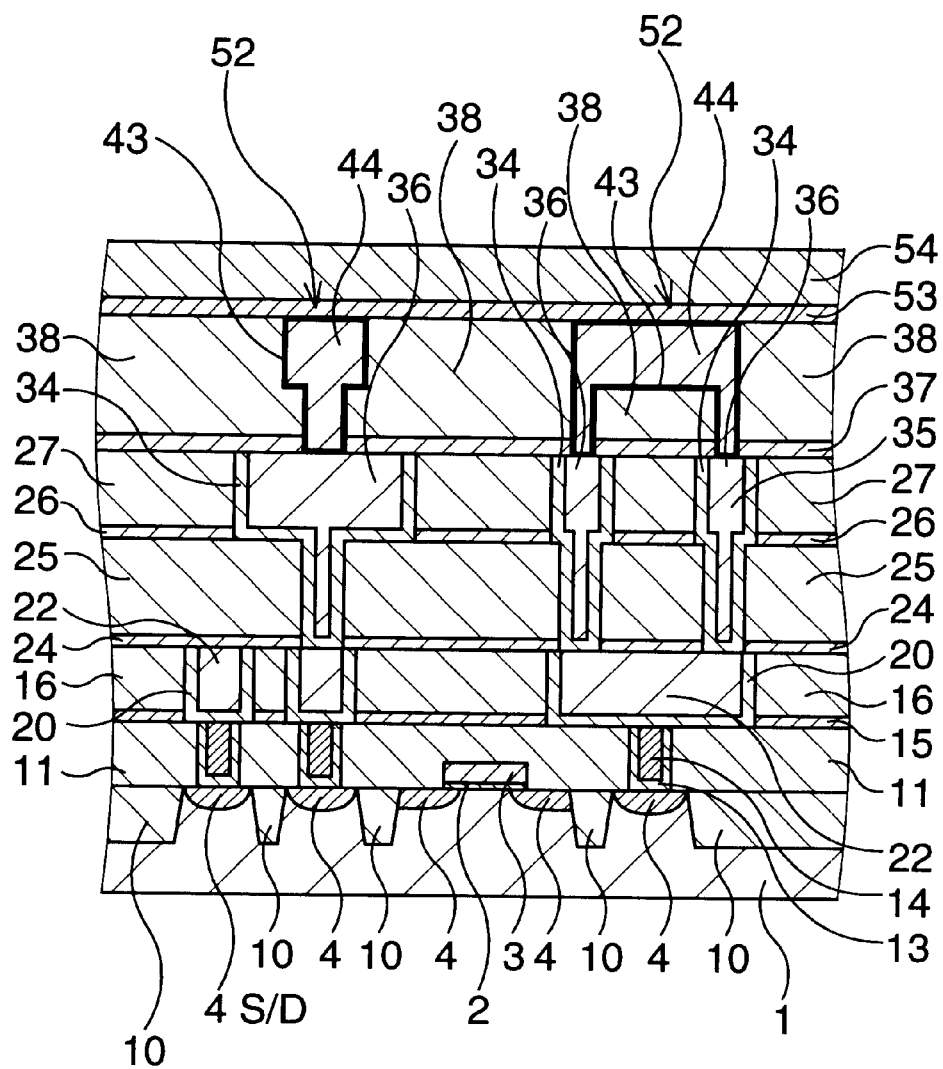
FIG. 9 is a schematic sectional view showing the main components of the semiconductor device according to the first embodiment.

After that, as shown in FIG. 9, an SiN film 53 about 100 nm thick and an $SiO_2$ film 54 about 400 nm thick are formed as cover films, thereby completing a semiconductor device having the wiring structure described previously.

Cutting of Redundancy Fuse

A method by which the redundancy fuse 51 of the semiconductor device fabricated as above is cut to correct a defective portion formed during the fabrication process will be described below.

Figure 10A:
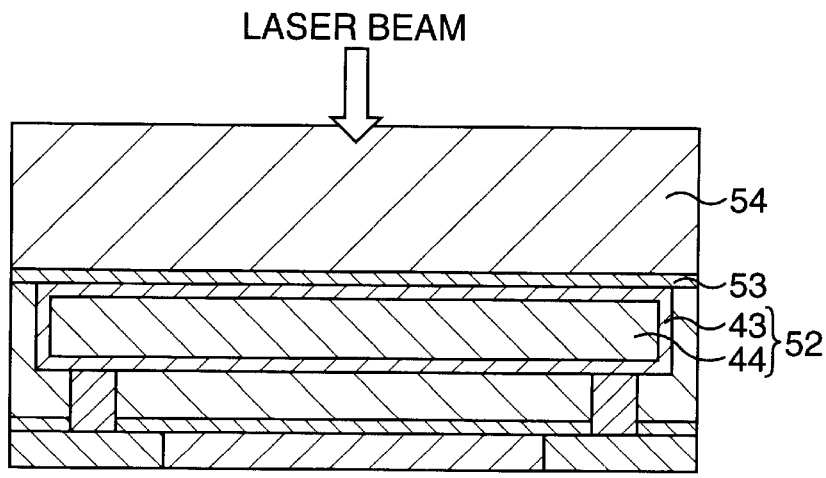
FIGS. 10A and 10B are schematic sectional views showing a redundancy fuse and its vicinity when the fuse is cut, in the semiconductor device according to the first embodiment.
Figure 10B:
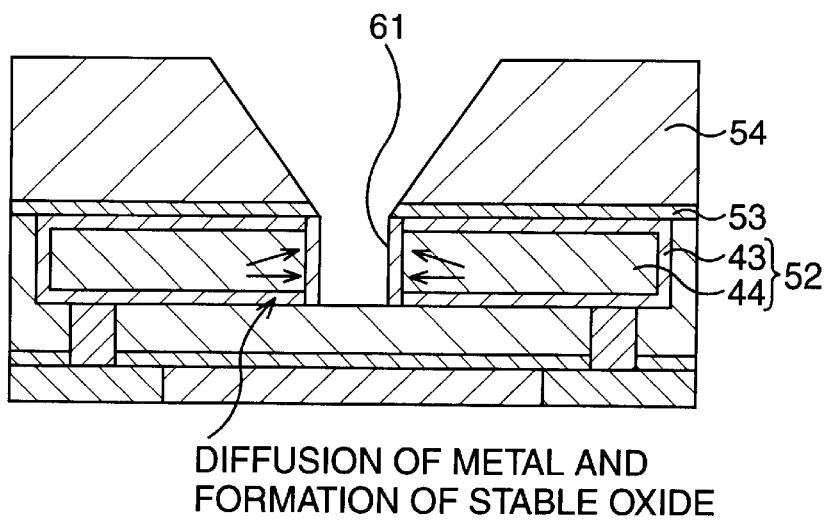
Figure 11:
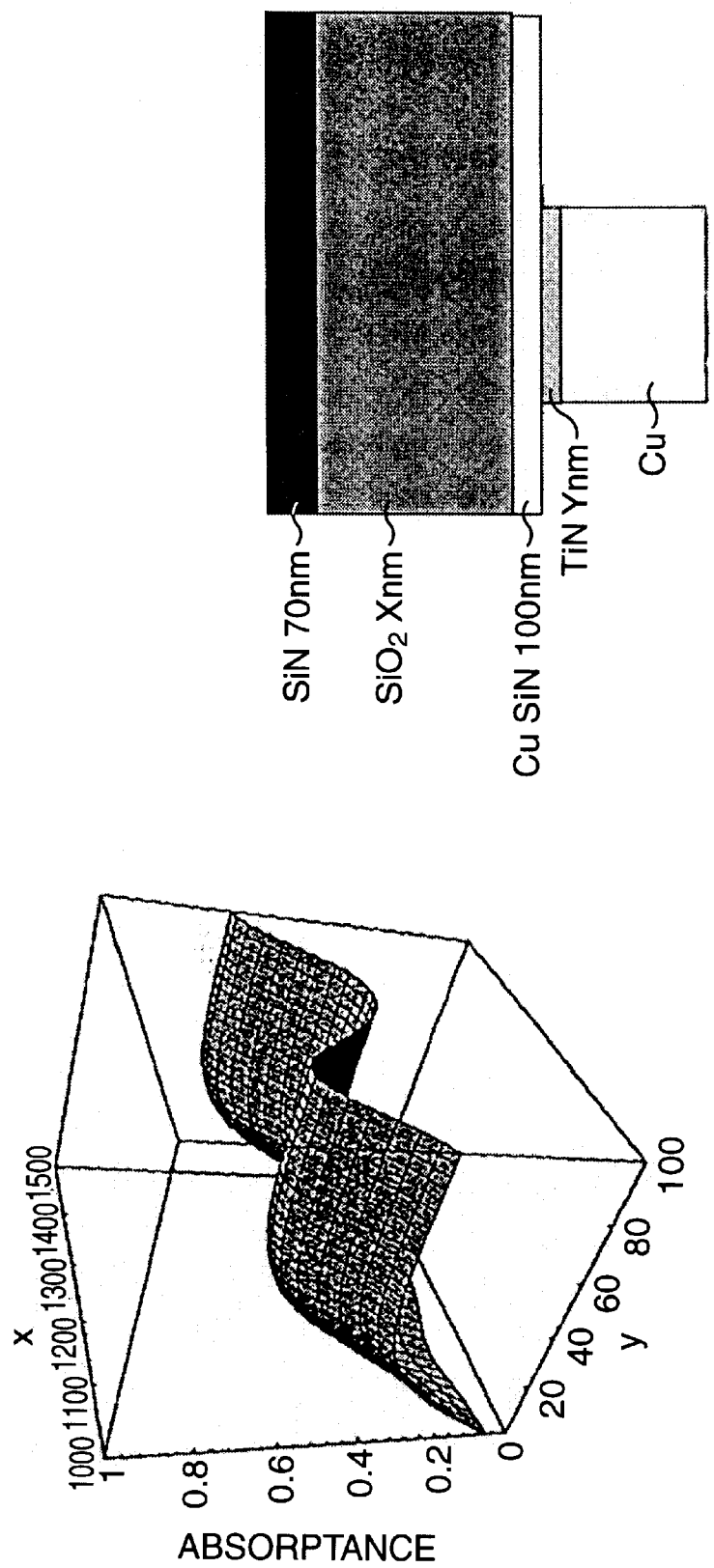
FIG. 11 is a graph showing the results when a simulation test was conducted on the relationship between the film thickness and the light absorptance, in order to check a preferred metal material film thickness for holding high absorption to the wavelength of a laser beam.
Figure 12:
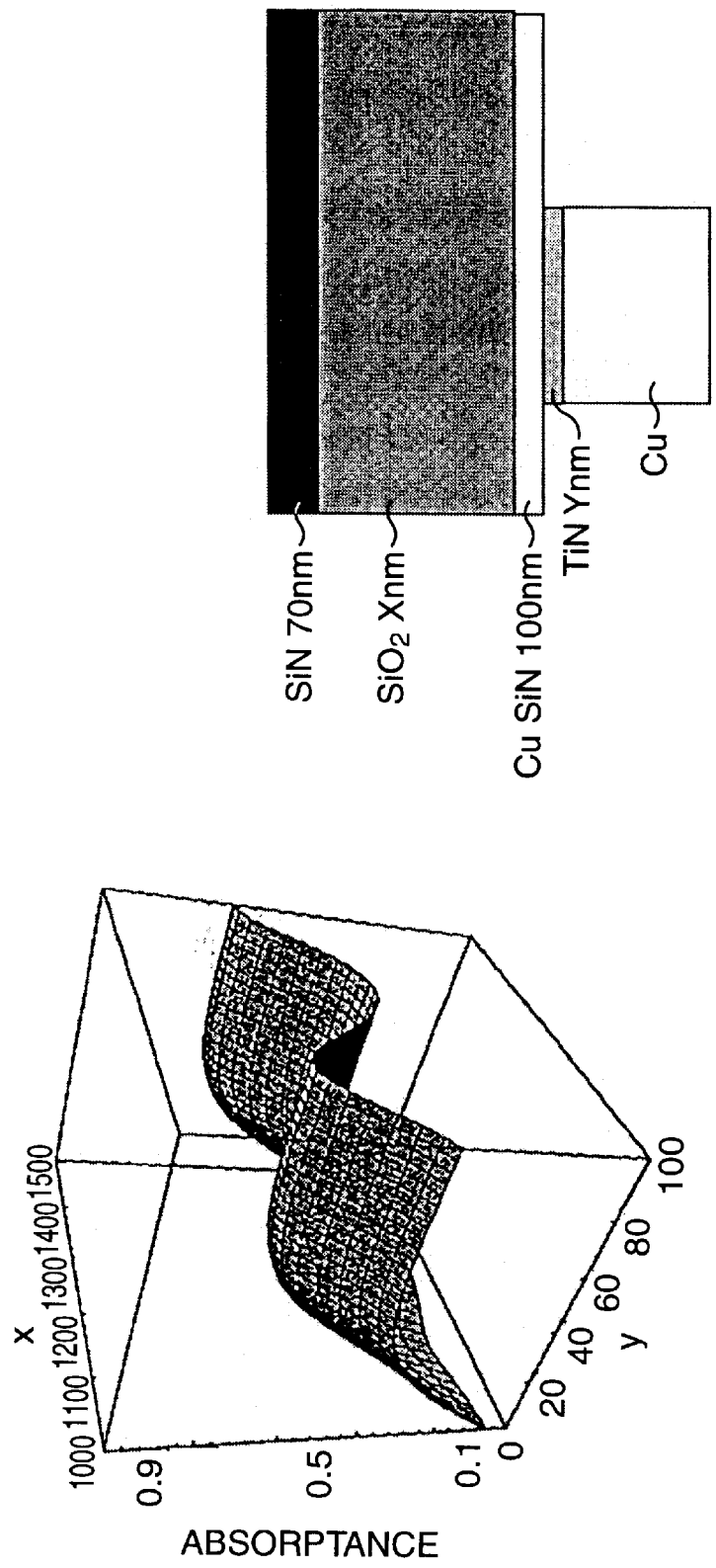
FIG. 12 is a graph showing the results when a simulation test was conducted on the relationship between the film thickness and the light absorptance, in order to check a preferred metal material film thickness for holding high absorption to the wavelength of a laser beam.
Figure 13:
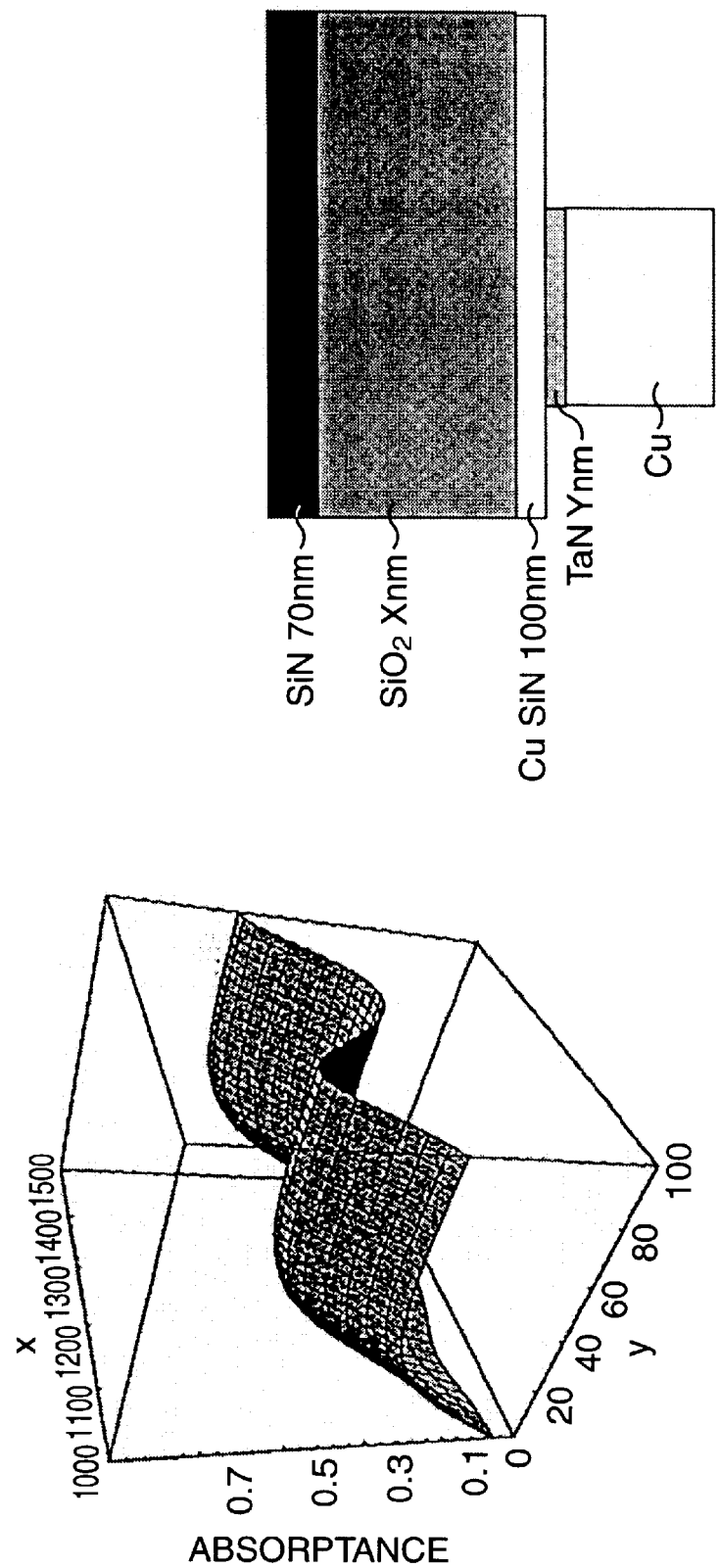
FIG. 13 is a graph showing the results when a simulation test was conducted on the relationship between the film thickness and the light absorptance, in order to check a preferred metal material film thickness for holding high absorption to the wavelength of a laser beam.
Figure 14:
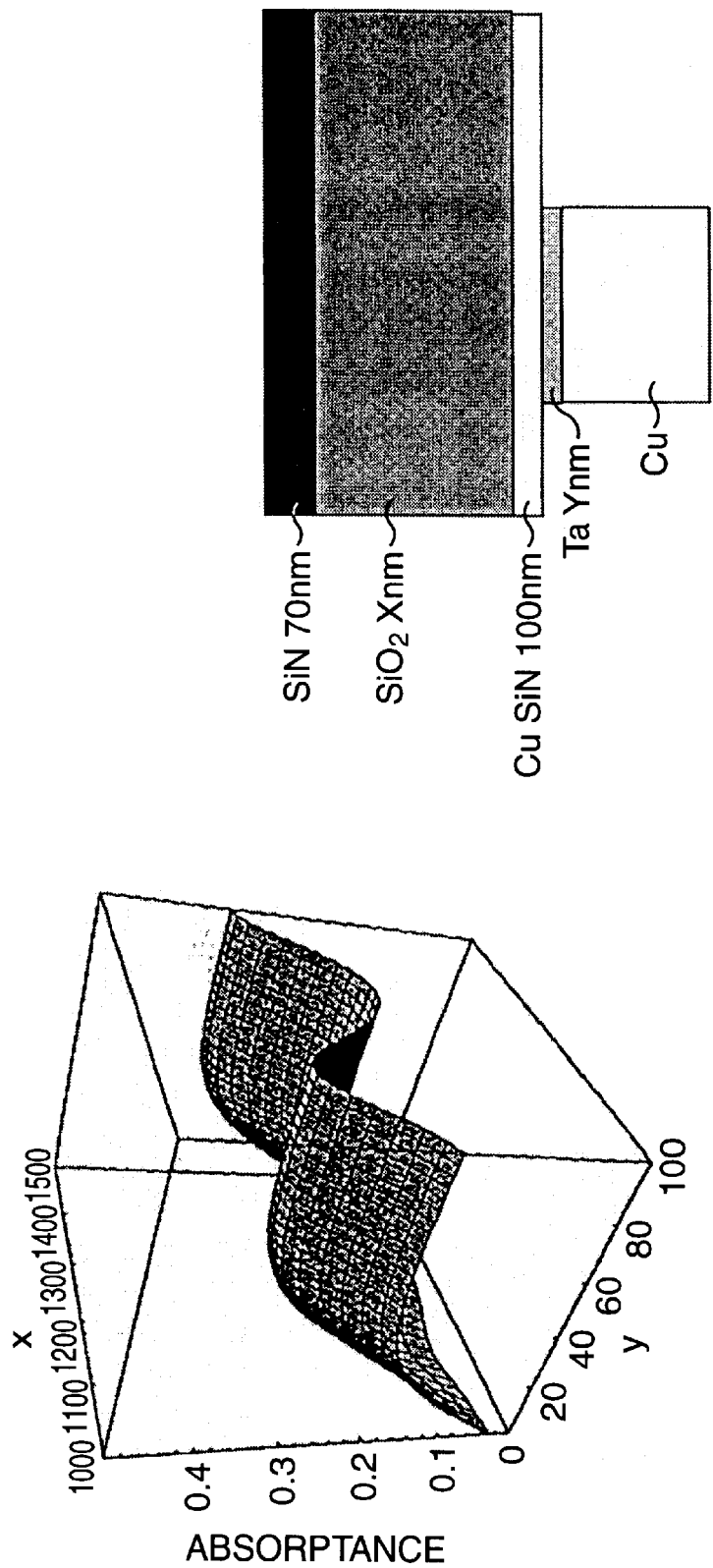
FIG. 14 is a graph showing the results when a simulation test was conducted on the relationship between the film thickness and the light absorptance, in order to check a preferred metal material film thickness for holding high absorption to the wavelength of a laser beam.
Figure 15:
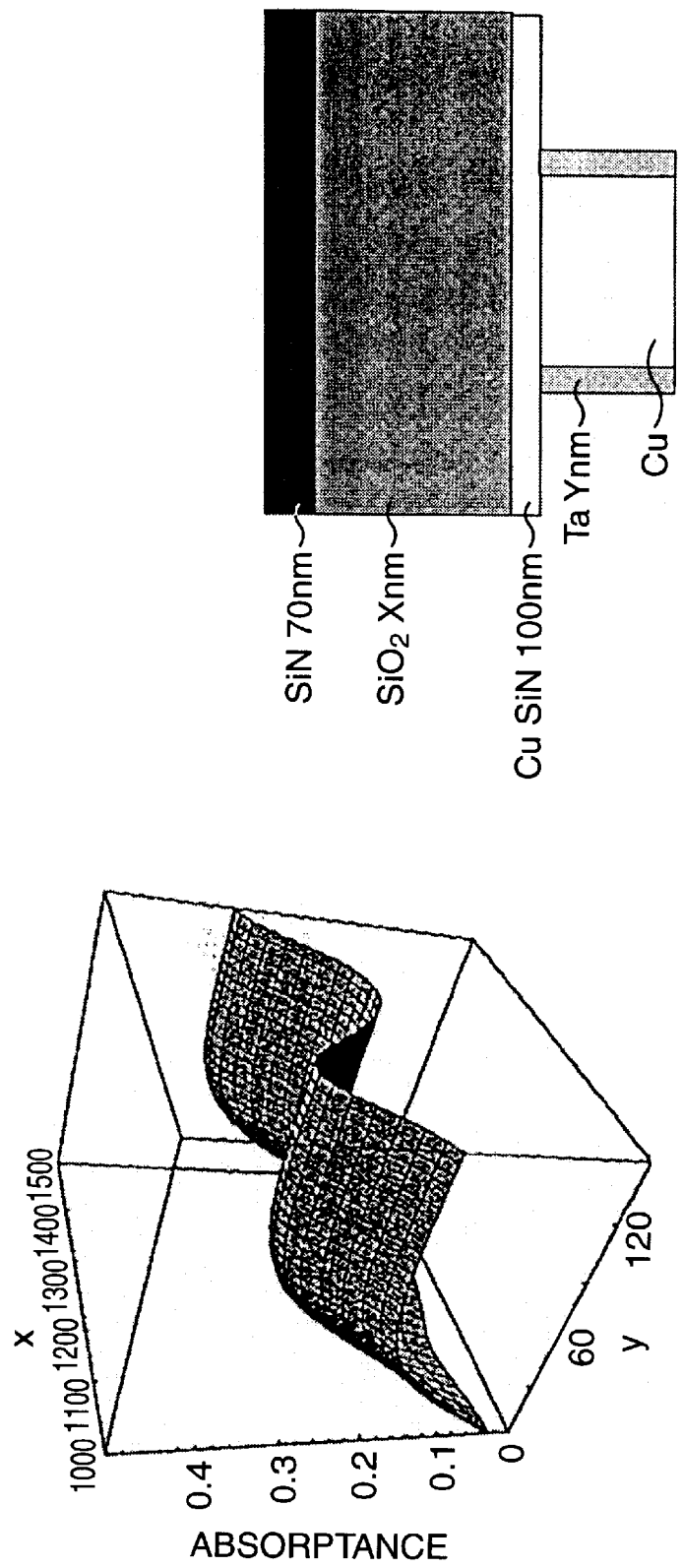
FIG. 15 is a graph showing the results when a simulation test was conducted on the relationship between the film thickness and the light absorptance, in order to check a preferred metal material film thickness for holding high absorption to the wavelength of a laser beam.

FIGS. 10A and 10B are schematic sectional views showing the redundancy fuse and its vicinity when the fuse is cut.

First, as shown in FIG. 10A, that portion of the $SiO_2$ film 54, which corresponds to a prospective cut portion of the redundancy fuse 51 is irradiated with a laser beam. The selected wavelength of this laser beam is hardly absorbed by silicon so as not to cause any damage to the silicon semiconductor substrate 1. For example, preferred cutting conditions are a laser wavelength of 1.3 $\mu$m, a laser energy of 1.0 $\mu$J, a pulse width of 12 nsec, and a spot diameter of 2.5 $\mu$m.

When the laser beam is emitted under the above cutting conditions, as shown in FIG. 10B, the irradiated portions of the $SiO_2$ film 54 and the SiN film 53 evaporate. In addition, since the TiN film 43 has high absorptance to a laser beam having this irradiation condition (wavelength), the TiN film 43 well absorbs this laser beam to cause an abrupt temperature rise. As a consequence, the redundancy fuse 51 is cut in the irradiated portion.

The Cu—Al alloy film 44 in the cut portion of this redundancy fuse 51 thermally diffuses by the abrupt temperature rise, and Al preferentially combines with oxygen because Al is baser than Cu. Accordingly, Al oxidizes in the atmosphere, and $AlO_x$ as the stable metal oxide produced sticks to the cut surfaces of the redundancy fuse 51 to form a film 61 in self-alignment. This film functions as a protective film to prevent the generation of corrosion. In this embodiment as described above, even when Cu interconnects are used in a semiconductor device and a Cu alloy is also used as the redundancy fuse 51 accordingly, it is possible to reliably cut the redundancy fuse 51 and protect the cut surfaces.

In addition, after the redundancy fuse 51 is cut, the cut surfaces can also be irradiated with a laser beam having energy lower than that of the above laser beam. More specifically, the cut surfaces are heated by irradiation by setting the laser energy to 0.01 µJ, the pulse width to 100 nsec, and the spot diameter to 5.0 µm. This further ensures the protection of the cut surfaces by the film 61 and improve the reliability.

In this embodiment, the TiN film 43 is formed as a film for covering the surrounding surface (the entire surface in this embodiment) of the Cu—Al alloy film 44. However, any metal material having absorption to the wavelength of a laser beam used to cut the redundancy fuse 51 can be used. For example, instead of TiN it is possible to preferably use one member or a combination of two or more members selected from Ti, W, WN, Ta, TaN, and TiW.

To check the thickness of a metal material film suited to holding high absorption to the wavelength of a laser beam, the relationship between the film thickness and the light absorptance was simulated for a TiN film, Ti film, TaN film, and Ta film.

The experimental results are shown in FIGS. 11 to 15. The results of the TiN, Ti, TaN, and Ta films are shown in FIG. 11, FIG. 12, FIG. 13, and FIGS. 14 and 15, respectively. The experiments were conducted by forming a metal material film on the upper surface of a Cu layer in each of FIGS. 11 to 14, and by forming a metal material film on the side surfaces of a Cu layer in FIG. 15.

As a consequence, when a metal material film was formed on the upper surface of a Cu layer, a film thickness of 20 nm or more was necessary to obtain sufficient absorptance (about 0.2 or more). When a metal material film was formed on the side surfaces of a Cu layer, a film thickness of 60 nm or more was necessary to obtain sufficient absorptance (about 0.2 or more). In this embodiment, sufficient absorptance is ensured because the TiN film 43 about 100 nm thick is formed.

Although an example in which the Cu—Al alloy film 44 is formed is disclosed above, a semiconductor device need only contain a metal which is baser than Cu and can form a metal oxide earlier than Cu when contacting the atmosphere. Therefore, it is also preferable to form a Cu alloy film by using one element selected from Mg, Zr, and Be, instead of Al, or by using a combination of two or more elements selected from Mg, Zr, Be, and Al. Similar to the Cu—Al alloy film, the addition amount of these metals is favorably a value within the range of 1 to 10 atm %.

In this embodiment, criteria for the selection of a Cu alloy as the constituent element of the redundancy fuse 51 are:

① A rise of the resistivity caused by the addition of an alloy-forming metal to Cu is low.

② In the Cu alloy formation step, the metal easily diffuses into Cu.

③ When the redundancy fuse is cut, a film is readily formed in self-alignment.

It is preferable to choose an alloy on the basis of these three viewpoints.

Figure 16:
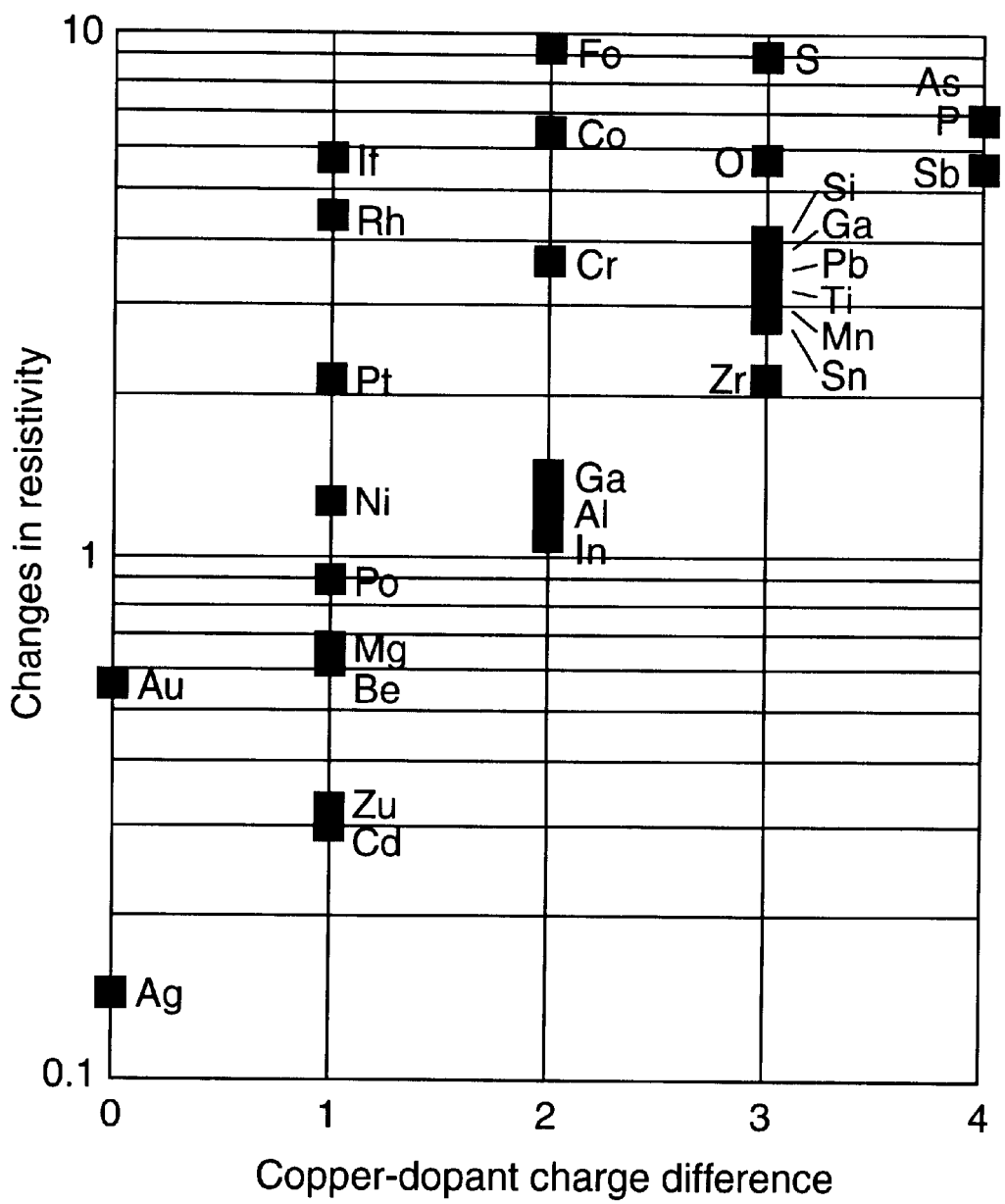
FIG. 16 is a graph showing the degrees of rises of the resistivity when different metals were added to Cu.

As to viewpoint ①, FIG. 16 shows the degrees of rises of the resistivity when different metals were added to Cu.

As shown in FIG. 16,

Cu—Mg and Cu—Be: +0.6 µΩcm/at %

Cu—Al: +1.0 µΩcm/at %

Cu—Zr: +2.0 µΩcm/at %

The alloys are superior in this order in respect of viewpoint ①.

As to viewpoint ②, the diffusion coefficients of the metals at a temperature of 1,000° C. are Be: $6.6 \times 10^{-5}$ (cm$^2$/s)

Al: $1.31 \times 10^{-5}$ (cm$^2$/s)

The metals are superior in this order in respect of viewpoint ②. It is difficult to obtain data of Mg and Zr because both liquid and solid phases exist, so the making of any estimation should be avoided.

As to viewpoint ③, the values of the generation free energy (ΔG) of oxides containing the metals are:

BeO: −140 (kcal/g. atom $O_2$)

MgO: −136 (kcal/g. atom $O_2$)

⅓ $Al_2O_3$: −125.6 (kcal/g. atom $O_2$)

½ $ZrO_2$: −123.5 (kcal/g. atom $O_2$)

The metals are superior in the order of Be, Mg, Al, and Zr in respect of viewpoint ③.

In actually selecting an alloy, it is only necessary to make the selection by totally considering the above criteria and various other fabrication conditions.

In this embodiment, wiring formation by the dual damascene process by which via holes and wiring trenches are simultaneously filled with Cu (alloy) is explained. However, it is also possible to use the single damascene process by which via holes and wiring trenches are separately filled with Cu (alloy). In this case, a via hole in which no redundancy fuse is to be formed can also be preferably filled with pure Cu (non-alloy Cu).

As described above, this embodiment can implement a semiconductor device including Cu interconnects and a Cu-containing fuse, which allows the redundancy fuse to be stably and reliably cut and, after the cutting, does not produce any inconvenience such as corrosion even in a normal temperature·humidity (e.g., a temperature of 27° C. and a humidity of 60%) atmosphere, thereby preventing defective operations and achieving high reliability.

(Second Embodiment)

Next, the second embodiment of the present invention will be described below.

In this embodiment, as in the first embodiment, a semiconductor device including a wiring structure having a Cu multi-level interconnect and a redundancy fuse and a method of fabricating the same will be explained. The second embodiment differs from the first embodiment in that the steps of fabricating the redundancy fuse are slightly different.

FIGS. 17A to 18B are schematic sectional views showing the method of fabricating the semiconductor device according to the second embodiment in order of steps. For the sake of convenience, the same reference numerals as in the semiconductor device explained in the first embodiment denote the same constituent members, and a detailed description thereof will be omitted. Also, the structure of the semiconductor device will be explained along with its fabrication method as in the first embodiment.

First, similar to the first embodiment, a MOS transistor structure and a lower wiring layer including first interconnects 23 and second interconnects 36 are formed through the steps shown in FIGS. 1A to 6B.

Figure 17A:
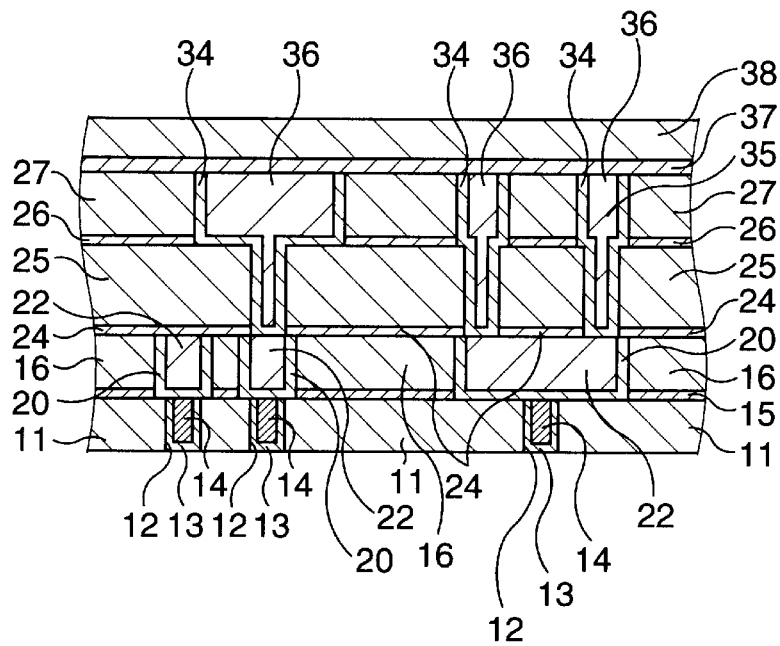
FIGS. 17A and 17B are schematic sectional views showing a method of fabricating a semiconductor device according to the second embodiment in order of steps.

As shown in FIG. 17A, an $Si_3N_4$ film 37 about 100 nm thick serving as a diffusion barrier (passivation) on the surfaces of the second interconnects 36 is deposited. After that, an $SiO_2$ film 38 about 2 μm thick is formed as a dielectric interlayer, and the surface layer of this $SiO_2$ film 38 is planarized by CMP until the film thickness becomes about 1 μm.

Figure 17B:
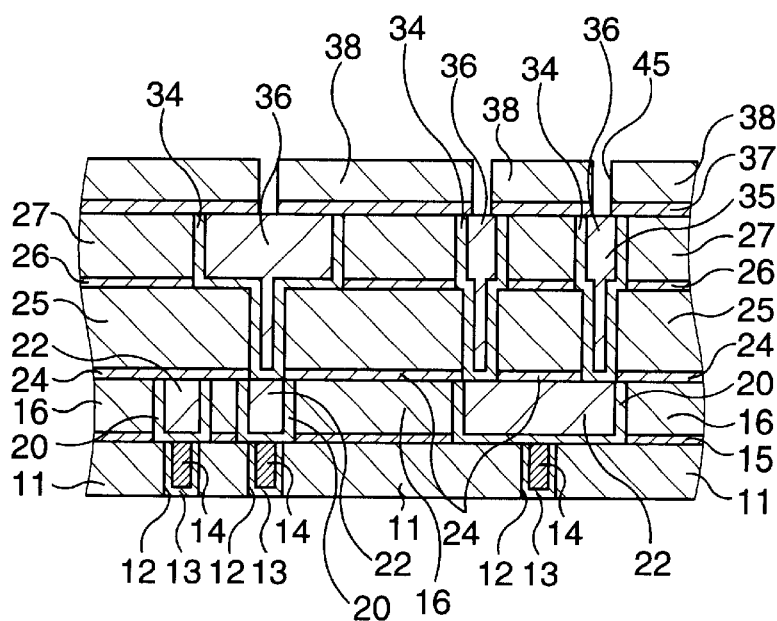

Subsequently, as shown in FIG. 17B, the $Si_3N_4$ film 37 and the $SiO_2$ film 38 are patterned to form via holes 45 partially exposing the surfaces of the second interconnects 36.

Figure 18A:
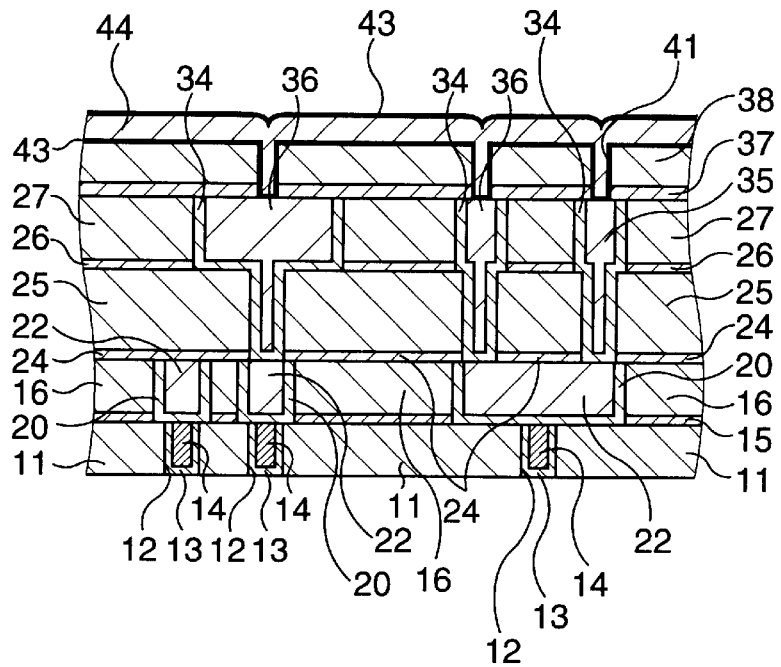
FIGS. 18A and 18B are schematic sectional views showing the method of fabricating the semiconductor device according to the second embodiment in order of steps following FIGS. 17A and 17B.

As shown in FIG. 18A, a TiN film 43 about 70 nm thick, a Cu—Al alloy film 44 about 700 nm thick, and another TiN film 43 about 70 nm thick are formed in this order by sputtering. The Al addition amount of the Cu—Al alloy film 44 is preferably a value within the range of 1 to 10 atm %, since a large addition amount by which a metal oxide film can be reliably formed is necessary when a redundancy fuse is cut. In this embodiment, the Al addition amount is 0.8 atm %.

As in the first embodiment, an example in which the TiN film 43 is formed as a film for covering the surrounding surface of the Cu—Al alloy film 44 is disclosed above. However, any metal material having absorption to the wavelength of a laser beam used to cut a redundancy fuse 51 can be used. For example, instead of TiN it is possible to preferably use one member or a combination of two or more members selected from Ti, W, WN, Ta, TaN, and TiW.

Also, although an example in which the Cu—Al alloy film 44 is formed is disclosed above, a semiconductor device need only contain a metal which is baser than Cu and can form a metal oxide earlier than Cu when contacting the atmosphere. Therefore, it is also preferable to form a Cu alloy film by using one element selected from Mg, Zr, and Be, instead of Al, or by using a combination of two or more elements selected from Mg, Zr, Be, and Al. Similar to the Cu—Al alloy film, the addition amount of these metals is favorably a value within the range of 1 to 10 atm %.

Subsequently, an $SiO_2$ film (not shown) about 1 μm thick is formed on the TiN film 43 by plasma CVD and patterned to form an etching mask. This etching mask is used to pattern the upper and lower TiN films 43 and the Cu—Al alloy film 44 at a substrate temperature of 230° C. to 270° C. by using $Cl_2$ gas as an etching gas.

Figure 18B:
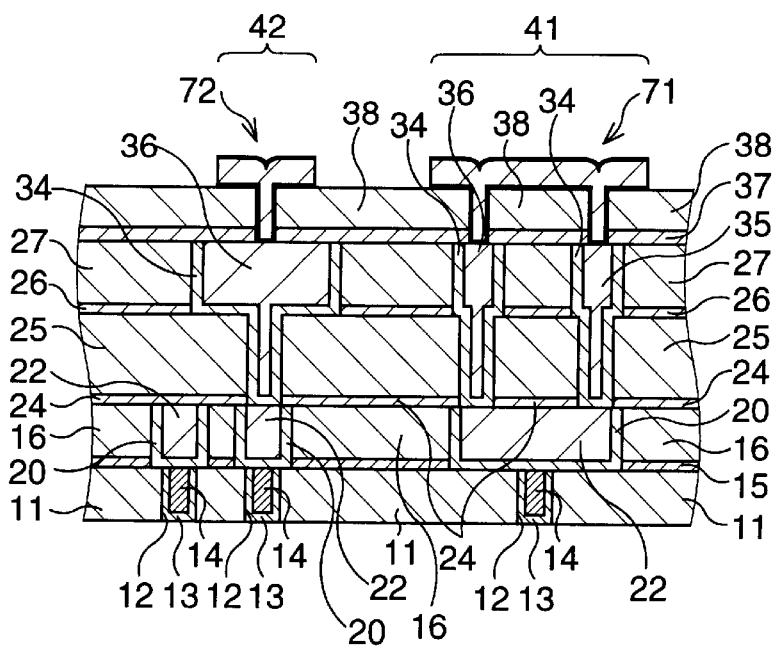

Consequently, as shown in FIG. 18B, the right-hand region forms a fuse region 41, and the left-hand region forms a wiring region 42. In the fuse region 41, a redundancy fuse 71 is formed which fills the via hole 45 and consists of the TiN films 43 and the Cu—Al alloy film 44 vertically sandwiched by these TiN films 43. In the wiring region 42, an upper wiring layer 72 is formed which similarly consists of the TiN films 43 and the Cu—Al alloy film 44 vertically sandwiched by these TiN films 43.

Figure 19:
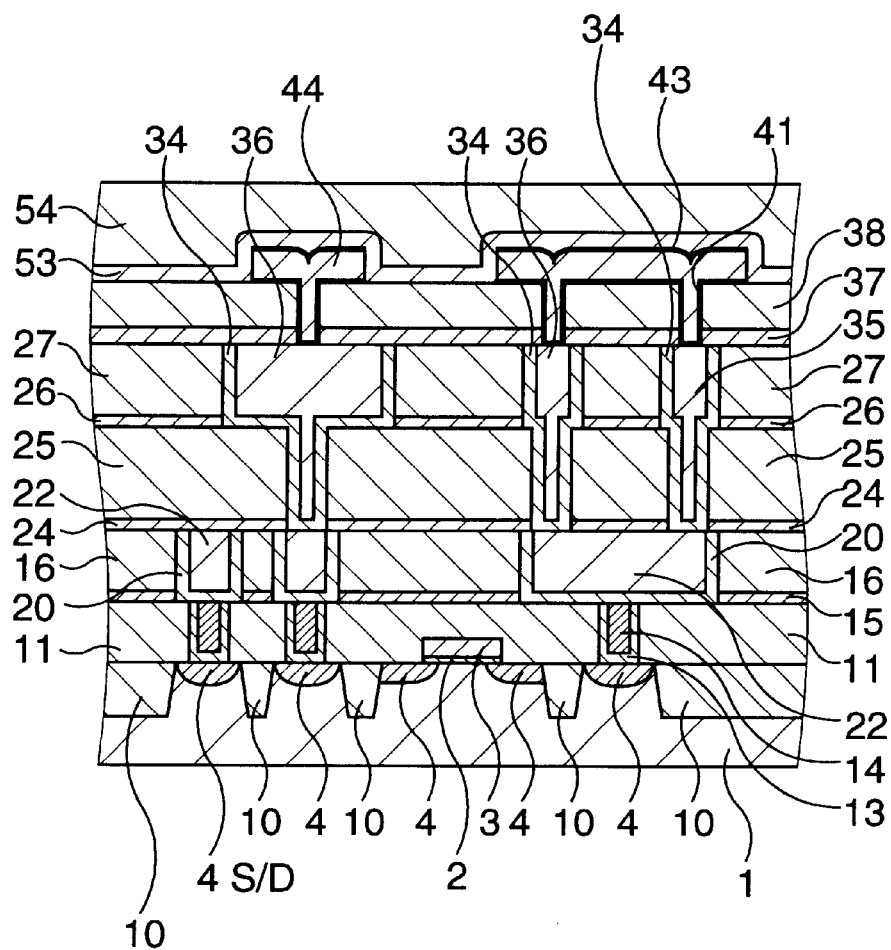
FIG. 19 is a schematic sectional view showing the main components of the semiconductor device according to the second embodiment.

After that, as shown in FIG. 19, an SiN film 53 about 100 nm thick and an $SiO_2$ film 54 about 400 nm thick are formed as cover films, thereby completing a semiconductor device having the wiring structure described previously.

When the redundancy fuse 71 of the semiconductor device with the above arrangement is to be cut under the same conditions as in the first embodiment, the irradiated portions of the $SiO_2$ film 54 and the SiN film 53 evaporate. In addition, since the TiN films 43 have high absorptance to a laser beam having this irradiation condition (wavelength), these TiN films 43 well absorb this laser beam to cause an abrupt temperature rise. As a consequence, the redundancy fuse 71 is cut in the irradiated portion.

The Cu—Al alloy film 44 in the cut portion of this redundancy fuse 71 thermally diffuses by the A abrupt temperature rise, and Al preferentially combines with oxygen because Al is baser than Cu. Accordingly, Al oxidizes in the atmosphere, and $AlO_x$ as the stable metal oxide produced sticks to the cut surfaces of the redundancy fuse 71 to form a film 61 in self-alignment. This film functions as a protective film to prevent the generation of corrosion. In this embodiment as described above, even when Cu interconnects are used in a semiconductor device and a Cu alloy is also used as the redundancy fuse 71 accordingly, it is possible to reliably cut the redundancy fuse 51 and protect the cut surfaces.

Similar to the first embodiment, after the redundancy fuse 71 is cut, the cut surfaces can also be irradiated with a laser beam having energy lower than that of the above laser beam. More specifically, the cut surfaces are heated by irradiation by setting the laser energy to 0.01 μJ, the pulse width to 100 nsec, and the spot diameter to 5.0 μm. This further ensures the protection of the cut surfaces by the film 61 and improve the reliability.

As described above, this embodiment can implement a semiconductor device including Cu interconnects and a Cu-containing fuse, which allows the redundancy fuse 71 to be stably and reliably cut and, after the cutting, does not produce any inconvenience such as corrosion even in a normal temperature-humidity (e.g., a temperature of 27° C. and a humidity of 60%) atmosphere, thereby preventing defective operations and achieving high reliability.

Although a redundancy fuse is used as a fuse in each of the above embodiments, the present invention is not limited to these embodiments. For example, the fuse of the present invention is also applicable to a blown interconnect for performing programming, as well as to a redundancy fuse. A ROM including this blown interconnect is called an FPGA (Field Programmable Gate Array). High reliability of the product can be ensured by using Cu interconnects in this ROM and the fuse of the present invention as a blown interconnect.

As has been described above, it is possible to interconnect and a Cu-containing fuse, which allows the fuse to be stably and reliable cut and, after the cutting, does not produce any inconvenience such as corrosion even if exposed to the atmosphere, thereby preventing defective operations and achieving high reliability.

What is claimed is:

1. A semiconductor device comprising a wiring structure having an interconnect and fuse made of a material containing at least Cu, wherein
    said fuse comprises:
        an alloy material consisting of a metal capable of forming a metal oxide and Cu; and
        a metal material which covers the surrounding surface of said alloy material and has absorption to the wavelength of a laser beam used to cut said fuse;
        wherein when said fuse is cut by the laser beam, a film containing said metal oxide is formed to cover the cut surfaces.

2. The device according to claim 1, wherein the surrounding surface of said alloy material is at least one of the upper surface and side surface of said alloy material.

3. The device according to claim 2, wherein when formed on the upper surface of said alloy material, said metal material has a film thickness of at least 20 nm.

4. The device according to claim 2, wherein when formed on the side surface of said alloy material, said metal material has a film thickness of at least 60 nm.

5. The device according to claim 1, wherein said metal material contains at least a transition metal.

6. The device according to claim 5, wherein said metal material is one member or a combination of not less than two members selected from the group consisting of Ti, TiN, W, WN, Ta, TaN, and TiW.

7. The device according to claim 1, wherein the metal capable of forming said metal oxide is one member or a combination of not less than two members selected from the group consisting of Mg, Zr, Al, and Be.

8. The device according to claim 7, wherein the content of the metal capable of forming said metal oxide in said alloy material is a value within the range of 1 to 10 atm %.

9. A method of fabricating a semiconductor device, comprising the steps of:

forming an interconnect made of a material containing at least Cu; and forming a fuse by using an alloy material and a metal material, said alloy material consisting of a metal capable of forming a metal oxide and Cu, and said metal material covering the surrounding surface of said alloy material and having absorption to the wavelength of a laser beam used to cut said fuse;

cutting said fuse by irradiating said fuse with the laser beam;

wherein in the cutting step, a film containing said metal oxide is formed to cover the cut surfaces of said fuse.

10. The method according to claim 9, wherein the surrounding surface of said alloy material is at least one of the upper surface and side surface of said alloy material.

11. The method according to claim 10, wherein when formed on the upper surface of said alloy material, said metal material has a film thickness of at least 20 nm.

12. The method according to claim 10, wherein when formed on the side surface of said alloy material, said metal material has a film thickness of at least 60 nm.

13. The method according to claim 9, wherein said metal material contains at least a transition metal.

14. The method according to claim 13, wherein said metal material is one member or a combination of not less than two members selected from the group consisting of Ti, TiN, W, WN, Ta, TaN, and TiW.

15. The method according to claim 9, wherein the metal capable of forming said metal oxide is one member or a combination of not less than two members selected from the group consisting of Mg, Zr, Al, and Be.

16. The method according to claim 15, wherein the content of the metal capable of forming said metal oxide in said alloy material is a value within the range of 1 to 10 atm %.

17. The method according to claim 9, further comprising, after the cutting step, the step of irradiating said fuse with a laser beam having energy weaker than that of the laser beam used in the cutting step.

18. The method according to claim 9, further comprising, after the cutting step, the step of irradiating said fuse with a laser beam having energy weaker than that of the laser beam used in the cutting step.

* * * * *